United States Patent
Lin-Lefebvre et al.

(10) Patent No.: US 10,497,838 B2
(45) Date of Patent: Dec. 3, 2019

(54) METHOD FOR PRODUCING AN OPTIC DEVICE, OPTIC DEVICE AND ASSEMBLY COMPRISING SUCH AN OPTIC DEVICE

(71) Applicant: OSRAM Opto Semiconductors GmbH, Regensburg (DE)

(72) Inventors: I-Hsin Lin-Lefebvre, Regensburg (DE); Reinhard Streitel, Laaber (DE); Darshan Kundaliya, Beverly, MA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/952,194

(22) Filed: Apr. 12, 2018

(65) Prior Publication Data

US 2019/0319174 A1    Oct. 17, 2019

(51) Int. Cl.
 *H01L 33/50* (2010.01)
 *C09K 11/77* (2006.01)
 *H01L 33/00* (2010.01)
 *C09K 11/08* (2006.01)

(52) U.S. Cl.
 CPC ........ *H01L 33/501* (2013.01); *C09K 11/0883* (2013.01); *C09K 11/7792* (2013.01); *C09K 11/7795* (2013.01); *H01L 33/005* (2013.01); *H01L 2933/0041* (2013.01)

(58) Field of Classification Search
 CPC . H01L 33/501; H01L 33/005; C09K 11/0883; C09K 11/7792; C09K 11/7795
 See application file for complete search history.

(56) References Cited

U.S. PATENT DOCUMENTS

| | | | | |
|---|---|---|---|---|
| 8,968,044 B2* | 3/2015 | Hirakata | ............ | H01L 51/5246 313/504 |
| 2004/0046184 A1* | 3/2004 | Yanagawa | ............ | H01L 27/322 257/200 |
| 2004/0191566 A1* | 9/2004 | Kikuchi | ................ | H01L 51/529 428/690 |
| 2006/0186803 A1* | 8/2006 | Lim | .................... | H01L 51/5281 313/506 |
| 2011/0052857 A1* | 3/2011 | Suzuki | .................. | H05B 33/04 428/76 |

(Continued)

FOREIGN PATENT DOCUMENTS

EP         2549330 A1     1/2013

OTHER PUBLICATIONS

Gleason, K., et al., "Designing polymer surfaces via vapor deposition", Materialstoday, vol. 13, No. 5, May 2010, pp. 26-33.

*Primary Examiner* — Mark W Tornow
(74) *Attorney, Agent, or Firm* — Slater Matsil, LLP

(57) ABSTRACT

A method for producing an optic device, an optic device and an assembly including such an optic device are disclosed. In an embodiment, the method includes providing an active medium mechanically carried by a carrier body or included in the carrier body; applying an adhesive layer to at least one of the active medium or the carrier body, wherein the adhesive layer comprises at least one organic material and is applied by physical or chemical vapor phase deposition, and wherein a thickness of the adhesive layer is between 20 nm and 0.6 μm inclusive.

18 Claims, 5 Drawing Sheets

(56) References Cited

U.S. PATENT DOCUMENTS

2011/0163330 A1\* 7/2011 Kim ................... H01L 51/5256
 257/88
2011/0316802 A1\* 12/2011 Choi ....................... G06F 3/041
 345/173

\* cited by examiner

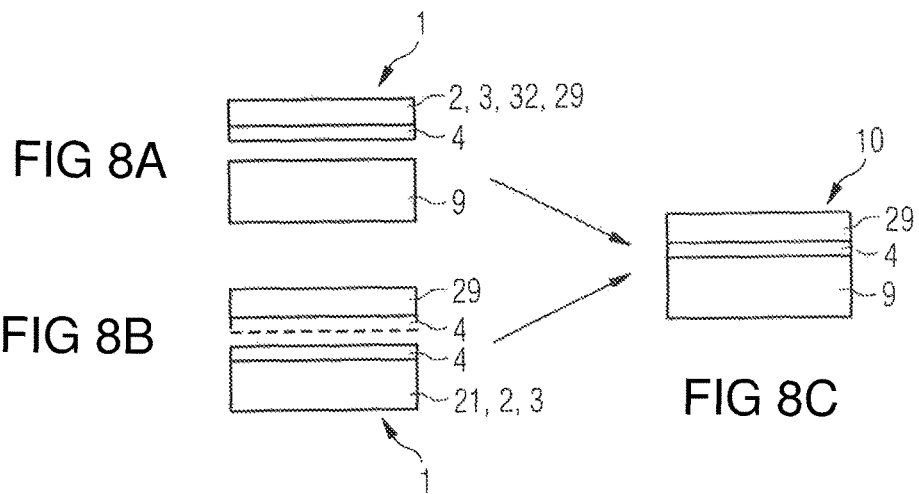
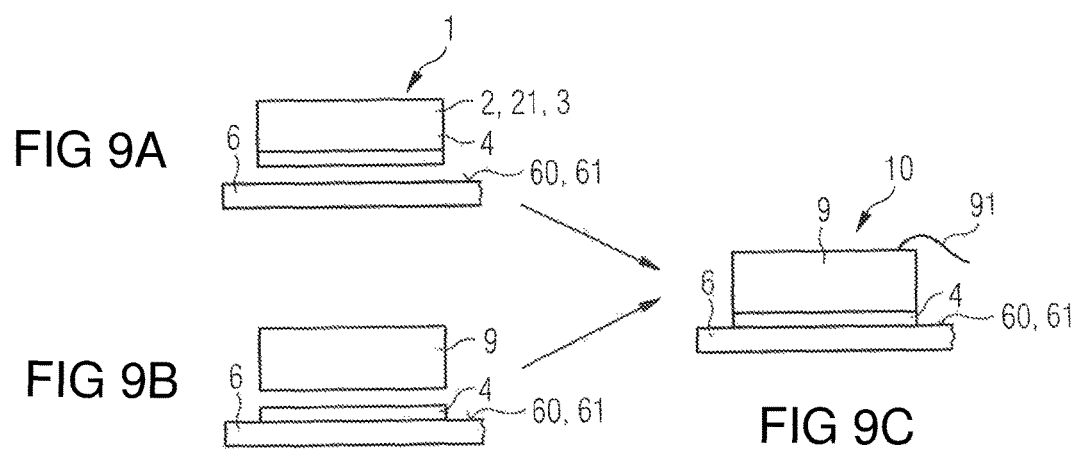

FIG 13

| Component | Material type | Chemical Formula/name | Thermal Conductivity [W/mK] | thickness Y [μm] | die size X and Y [mm] | | area [mm2] | Rth [K/W] |
|---|---|---|---|---|---|---|---|---|
| Chip Epi, 2 | GaN | GaN | 130 | 2 | 0,65 | 1,3 | 0,845 | 0,02 |
| Chip Submount, 3 | Saphire | Al2O3 | 25 | 150 | 0,65 | 1,3 | 0,845 | 7,10 |
| Leadframe, 6 | Ag+Cu | Ag+Cu | 390 | 100 | 0,65 | 1,3 | 0,845 | 0,30 |
| Die attach adhesive, 4/Silicone glue/ KER-3000-M2 | | | 0,2 | 1 | 0,65 | 1,3 | 0,845 | 5,92 |

Rth=thickness/(thermal conductivity * area)

chip size 650μm x 650μm 2 chips    chip area 0,65μm x 1,3μm

| Die attach adhesive thickness [μm] | Total Rth |
|---|---|
| 0,5 | 10,38 |
| 1 | 13,34 |
| 2 | 19,26 |

METHOD FOR PRODUCING AN OPTIC DEVICE, OPTIC DEVICE AND ASSEMBLY COMPRISING SUCH AN OPTIC DEVICE

TECHNICAL FIELD

A method for producing an optic device is provided. An optic device and an assembly with such an optic device are also provided.

SUMMARY

Embodiments provide a method for producing an optic device so that the optic device can be mounted with a reduced thermal resistance.

According to at least one embodiment, the optic device which is produced by the method is an optoelectronic semiconductor device such as an LED chip. Otherwise, the optic device is a phosphor component or also a support for an optoelectronic device wherein the support may be designed as a reflector for visible light at least in places. Preferably, with the method a plurality of such optic devices is manufactured. It is possible that at least some of the method steps described below are performed in a wafer assembly.

According to at least one embodiment, the method comprises the step of providing an active medium. The active medium is mechanically carried by a carrier body or is included in the carrier body. The active medium is a semiconductor layer sequence or an active zone of a semiconductor layer sequence, for example. Alternatively or in addition, the active medium is a phosphor.

According to at least one embodiment, the method comprises the step of applying an adhesive layer to at least one of the active medium and the carrier body. It is possible that the adhesive layer is applied both to the active medium as well as to the carrier body. The adhesive layer is designed to enable an adhesive coupling of the finished optic device to a support like a lead frame or a circuit board.

According to at least one embodiment, the adhesive layer comprises one or a plurality of organic materials. It is possible that the adhesive layer consists of one or of a plurality of organic materials. In particular, the adhesive layer is composed of one or a plurality of polymers. The term "organic material" as used herein also includes siloxanes and related materials in which a backbone may not be formed mainly with carbon atoms but with silicon atoms and oxygen atoms.

According to at least one embodiment, the adhesive layer is applied by physical vapor phase deposition, PVD for short, or by chemical vapor phase deposition, CVD for short. That is, the adhesive layer is formed from the vapor phase and not with liquid-based techniques like printing or casting or spin-coating.

According to at least one embodiment, a thickness of the adhesive layer is at least 20 nm or 50 nm. As an alternative or in addition, the thickness of the adhesive layer is at most 0.6 μm or 0.4 μm or 0.2 μm. That is, the adhesive layer is thin. Adhesive layers which are formed by spin-coating or printing, for example, typically have thicknesses of around 1 μm or more. Thus, as the adhesive layer is formed by PVD or CVD it can be comparably thin.

In at least one embodiment the method is for producing an optic device. The method comprises the following steps, preferably in the stated sequence: providing an active medium which is mechanically carried by a carrier body or which is included in the carrier body, and applying an adhesive layer to at least one of the active medium and the carrier body, wherein the adhesive layer comprises at least one organic material and is applied by physical or chemical vapor phase deposition and has a thickness of between 20 nm and 0.6 μm inclusive.

With the method described here, by using vapor phase deposition methods, a robust, homogenous, reproducible, ultrathin adhesive layer, in particular between a light-emitting diode, LED for short, and a lead frame substrate can be realized.

A conventional polymer-based adhesive layer at an LED/lead frame interface may be applied mainly via stamping or jetting processes. As polymer monomers then are applied mostly in a fluidic phase, de-wetting and surface tension effects occurring at an interface determine the adhesive layer thickness and the geometry thereof, that is a bondline thickness and adhesive coverage, respectively.

Vapor phase deposition of polymers is described in the article Ayse Asatekin et al., "Designing Polymer Surfaces via Vapor Deposition" in Materials Today, May 2010, Vol. 13, No. 5, pages 26 to 33. This article is incorporated herein by reference in its entirety. Of particular interest is the application of polymers, see the section "CVD Polymerization Chemistry" on pages 27 to 30.

That is, in the method described herein, CVD polymerization methods are implemented to apply the adhesive layer onto LED chip back sides on a wafer-level scale, in particular. The CVD and PVD polymerization methods are suitable for an ultrathin polymeric coating/layer formation, wherein ultrathin means nanometer to micrometer thickness, and polymeric includes polysiloxanes. For example, an initiated CVD, iCVD for short, has been proved versatile for polymerization at a substrate of interest below 250° C. In this context, this temperature refers to a filament array, adsorption and polymerization then proceeds on a cooled substrate, in particular on a back side of an LED chip. A back side polymer-layer-coated chip wafer is then subjected to singulation and individual chips are ready to be further attached onto a lead frame, for example.

In addition, in combination with precision mask designs, the above-mentioned CVD and PVD polymerization methods are applicable onto a light kernel-like substrate wherein multiple LED chips will further be attached onto the mask-predefined adhesive polymeric regions.

That is, currently the bondline thickness applied via stamping is in the range of 1 μm to 6 μm. Applying a homogenous and thin adhesive polymeric layer via stamping remains a challenge. Contrary to that, an ultrathin polymeric layer realized via CVD methods could significantly reduce the thickness-dependent thermal resistance intrinsically related to the adhesive layer between an LED chip and a lead frame substrate, for example. Therefore, heat dissipation is enhanced because of the very thin adhesive layer described herein and, thus, the package-level performance of the optic device as well.

Moreover, as CVD methods avoid undesirable de-wetting, surface tensions, creeping and bleeding arising from liquid phase polymer stamping or jetting, the applied ultrathin adhesive polymeric layer has a well-defined adhesive coverage limited, for example, to an LED chip back side or to a lead frame substrate in a light kernel case. Thus, little-to-none adhesive fillets near chip sidewalls could be easily achieved.

According to at least one embodiment, the active medium is a semiconductor layer sequence comprising an active zone. During operation, in the active zone electromagnetic radiation is produced by means of electroluminescence, for example, blue, green or red light. As an alternative, infrared radiation is produced in the active zone, for example, with a wavelength of maximum intensity between 700 nm and 1 µm inclusive. In this case, the carrier body can be a substrate to which the semiconductor layer sequence is applied or on which the semiconductor layer sequence is grown. As an alternative, the semiconductor layer sequence itself can be the carrier body and the active medium is limited to the active zone. The latter applies in particular if the semiconductor layer sequence is self-supporting and mechanically stable.

According to at least one embodiment, the adhesive layer is solely applied on a side of the substrate facing away from the semiconductor layer sequence. As an alternative, the adhesive layer can also be applied to side faces of the substrate and/or to the semiconductor layer sequence, in particular on a side of the semiconductor layer sequence facing away from the substrate.

According to at least one embodiment, at least one of the adhesive layer and the substrate are light-transmissive for the electromagnetic radiation generated in particular in the active zone of the semiconductor layer sequence. That is, the electromagnetic radiation generated can reach a support to which the optic device is applied. Thus, the support can act as a mirror for the radiation through the substrate as well as through the adhesive layer.

According to at least one embodiment, the active medium is a phosphor. During operation, electromagnetic radiation is produced in the phosphor by means of photoluminescence. That is, the phosphor can be a conversion element that absorbs shortwave radiation and generates longer wave radiation. It is possible that the carrier body and/or the adhesive layer are light-transmissive for the electromagnetic radiation generated in the phosphor.

Moreover, it is possible that the optic device both comprises a semiconductor layer sequence with an active zone as well as a phosphor for producing longer wave radiation from at least a part of the radiation generated in the active zone. The semiconductor layer sequence and the phosphor can be connected to each other by means of the adhesive layer and by another adhesive layer to a support.

According to at least one embodiment, the semiconductor layer sequence is based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \leq n \leq 1$, $0 \leq m \leq 1$ and $n+m \leq 1$ applies. The semiconductor layer sequence may comprise dopants and additional constituents. For simplicity's sake, however, only the essential constituents of the crystal lattice of the semiconductor layer sequence are indicated, i.e., Al, As, Ga, In, N or P, even if these may in part be replaced and/or supplemented by small quantities of further substances. The semiconductor layer sequence is particularly preferably based on the AlInGaN material system.

The phosphor is preferably a luminescent material or a luminescent material mixture comprising at least one of the following substances: $Eu^{2+}$-doped nitrides such as $(Ca,Sr)AlSiN_3:Eu^{2+}$, $Sr(Ca,Sr)SiAl_2N_6:Eu^{2+}$, $(Sr,Ca)AlSiN_3*Si_2N_2O:Eu^{2+}$, $(Ca,Ba,Sr)Si_5N_8:Eu^{2+}$, $(Sr,Ca)[LiAl_3N_4]:Eu^{2+}$; garnets from the general system $(Gd,Lu,Th,Y)_3(Al,Ga,D)_5(O,X)_{12}$:RE with X=halide, N or divalent element, D=tri- or tetravalent element and RE=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs for instance from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$; nitrido-orthosilicates such as $AE_{2-x-a}RE_xEu_aSiO_{4-x}N_x$, $AE_{2-x-a}RE_xEu_aSi_{1-y}O_{4-x-y}N_x$ with RE=rare earth metal and AE=alkaline earth metal; orthosilicates such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM luminescent materials from the $BaO$—$MgO$—$Al_2O_3$ system such as $BaMgAl_{10}Or_1:Eu^{2+}$; halophosphates such as $M_5(PO_4)_3(Cl,F):(Eu^{2+},Sb^{3+},Mn^{2+})$; SCAP luminescent materials such as $(Sr,Ba,Ca)_5(PO_4)_3Cl:Eu^{2+}$. The luminescent materials stated in document EP 2 549 330 A1 may also be used as luminescent materials. With regard to the luminescent materials used, the disclosure content of this document is included by reference. "Quantum dots" may moreover also be introduced as converter material. Quantum dots in the form of nanocrystalline materials which contain a group II-VI compound and/or a group III-V compound and/or a group IV-VI compound and/or metal nanocrystals, are preferred in this case.

According to at least one embodiment, the carrier body is a matrix material in which the phosphor is embedded. In this case, the phosphor is present preferably as particles. As an alternative it is also possible that the phosphor itself forms the carrier body. In this case, the phosphor is, for example, sintered to a ceramic body.

According to at least one embodiment, the phosphor is in places in direct contact with the adhesive layer. This is the case, for example, if phosphor particles are located at side faces or bottom faces of the carrier body which forms the matrix material or if the carrier body itself is formed by the phosphor.

According to at least one embodiment, the adhesive layer comprises at least one of the following materials or consists of one or more of these materials: polyimide, siloxane, silicone, acrylate, epoxide. Preferably, the adhesive layer is an acrylate or a siloxane. Preferably, the adhesive layer comprises or consists of a hybrid material, in particular a silicone-epoxide hybrid material or an acrylate-epoxide hybrid material.

According to at least one embodiment, the adhesive layer is applied by at least one of pulsed laser deposition, sputtering, initiated chemical vapor phase deposition, oxidative chemical vapor phase deposition, evaporation. In particular, initiated and oxidative chemical vapor phase deposition are explained in the article Asatekin et al. as cited above.

According to at least one embodiment, the adhesive layer is formed of a plurality of organic materials and is grown of a plurality of sub-layers which are stacked one above the other. In particular, the adhesive layer only consists of organic materials, siloxanes inclusive. As an alternative, during manufacturing of the adhesive layer it is possible that inorganic materials are co-evaporated or co-deposited. Inorganic particles that could be used are in particular nanoparticles with mean diameters of at most 50 nm or 10 nm or 5 nm.

Such nanoparticles can be used to increase a thermal conductivity of the adhesive layer and/or to adjust the electrical properties of the adhesive layer. Such particles can be formed from oxides like titanium oxide or zirconium oxide or can also be metallic nanoparticles, for example, of silver or gold, or can also be electrically conductive transparent particles, for example, of zinc oxide or indium tin oxide, ITO for short. Carbon nanotubes may be used, too.

According to at least one embodiment, the adhesive layer comprises at least two kinds of different sub-layers which are stacked one above the other in an alternating manner. That is, the adhesive layer can be a two-component, 2C for short, adhesive. For example, the sub-layers intermix when the adhesive layer and the optic device are pressed onto the support. Hence, by means of intermixing, a curing of the adhesive layer may be triggered.

According to at least one embodiment, the adhesive layer comprises a cover layer which is an outermost layer and also may comprise a base layer. The cover layer is preferably comparably thin, for example, with a thickness of at most 10 nm or 5 nm. In particular, the cover layer is non-adhesive and is designed to be destroyed during mounting of the optic device. For example, the base layer is adhesive and is protected by the cover layer as long as the optic device is mounted. Hence, unintentional adhesion of the optic device to other components and/or degradation of the base layer prior to mounting can be reduced or avoided.

According to at least one embodiment, the method further comprises the step of mounting the optic device to a support. By means of the adhesive layer, the support and the optic device are permanently and firmly connected to one another. This method step is preferably performed after the active medium has been provided and after the adhesive layer has been applied to the active medium and/or to the carrier body.

According to at least one embodiment, the support is a lead frame. Preferably, the lead frame consists of one or of a plurality of metals, for example, of copper which can be coated with silver. By such a silver coating, a mirror can be realized on the lead frame. Instead of a metallic coating like silver, also dielectric or electrically conductive coatings like Bragg mirrors can also be used. When the support is a lead frame, in particular a metallic lead frame, the optic device preferably is an LED chip to produce light, in particular blue light.

According to at least one embodiment, the support has a mounting face which comprises a roughening. The roughening has a mean roughness Ra of at least 50 nm or 100 nm and/or of at most 0.5 µm or 0.2 µm, for example. During mounting, the adhesive layer is pressed onto the mounting face so that the roughening completely penetrates the adhesive layer in places. Thus, the support comes in direct contact with at least one of the carrier body and the active medium in places. A thickness of the adhesive layer prior to mounting preferably is at least 110% or 130% and/or at most 200% or 170% of the mean roughness Ra. In this case, an electrical connection between the support and the carrier body or the active medium can be realized by materials of the support itself. Thus, for realizing an electrical contact to the support it is not necessary that the adhesive layer is electrically conductive.

According to at least one embodiment, at least one of the support, the carrier body and the active medium comprises electric contact areas. For example, the electric contact areas are to be electrically connected by a solder or by an electrically conductive adhesive which can be different from the adhesive layer. Moreover, such electric contact areas may be electrically connected by bond wires.

According to at least one embodiment, during mounting on the support the adhesive layer remains as a contiguous layer without holes. Thus, it is possible that the adhesive layer completely covers the electric contact areas. As an alternative, the electric contact areas remain free of the adhesive layer in part. If the adhesive layer covers the electric contact areas in part or completely, the adhesive layer is preferably electrically conductive and, thus, can be of electrically conductive polymers and/or can include electrically conductive constituents like electrically conductive particles.

According to at least one embodiment, during mounting on the support, the electric contact areas remain completely free of the adhesive layer. In this case, the adhesive layer can be electrically insulating. It is possible that the electric contact areas and the adhesive layer are located on different sides of the carrier body and/or the active medium. As an alternative, seen in top view, the adhesive layer can be formed as a frame that surrounds the electric contact areas so that the electric contact areas and the adhesive layer can be located on the same side of the carrier body and/or the active medium.

According to at least one embodiment, during mounting on the support, the adhesive layer is cured by means of a temperature increase. The temperature increase is, for example, to at least 80° C. or 100° C. or 120° C. Preferably, the temperature increase is at most up to 200° C. or 150° C. or 125° C.

According to at least one embodiment, during mounting on the support, the adhesive layer is cured by means of radiation that initiates a photochemical reaction. The radiation for the photochemical curing can be generated in the active medium which may be the active zone of an LED chip. Otherwise, curing is done by means of an external light source, for example, through the carrier. The radiation used for photochemical curing is preferably near ultraviolet radiation or blue light.

According to at least one embodiment, immediately before mounting, the adhesive layer has a low viscosity and/or a low hardness. In particular, the viscosity of the adhesive layer is at most 500 Pa·s or 100 Pa·s or 20 Pa*s. It is possible that the hardness of the adhesive layer immediately before the mounting is at most Shore A10 or Shore A5 or Shore A2. These values preferably are valid for a temperature of 300 K, that is, room temperature. As an alternative, the adhesive layer can be comparably hard before mounting. The latter in particular applies if the adhesive layer is thermally cured.

Moreover, an optic device is provided. The optic device is produced by a method as described above. Thus, features of the optic device are also disclosed for the method and vice versa.

In at least one embodiment, the optic device is for producing light and is manufactured by the method as explained above. The optic device comprises an active medium in which, during operation, light is produced. A carrier body mechanically carries the active medium which is attached to the carrier body or which is included in the carrier body. A thickness of an adhesive layer which is of at least one organic material is at least 20 nm and at most 0.6 µm, inclusive.

Moreover, an assembly is also provided. The assembly is produced with an optic device as explained above. Hence, features of the optic device and of the method are also disclosed for the assembly and vice versa.

In at least one embodiment, the assembly is made of the optic device and further comprises a support. The optic device is firmly and permanently attached to the support by means of the adhesive layer.

BRIEF DESCRIPTION OF THE DRAWINGS

An optic device, a method and an assembly described herein are explained in greater detail below by way of exemplary embodiments with reference to the drawing.

Elements which are the same in the individual figures are indicated with the same reference numerals. The relationships between the elements are not shown to scale, however, but rather individual elements may be shown exaggeratedly large to assist in understanding.

In the figures:

Figure 1:
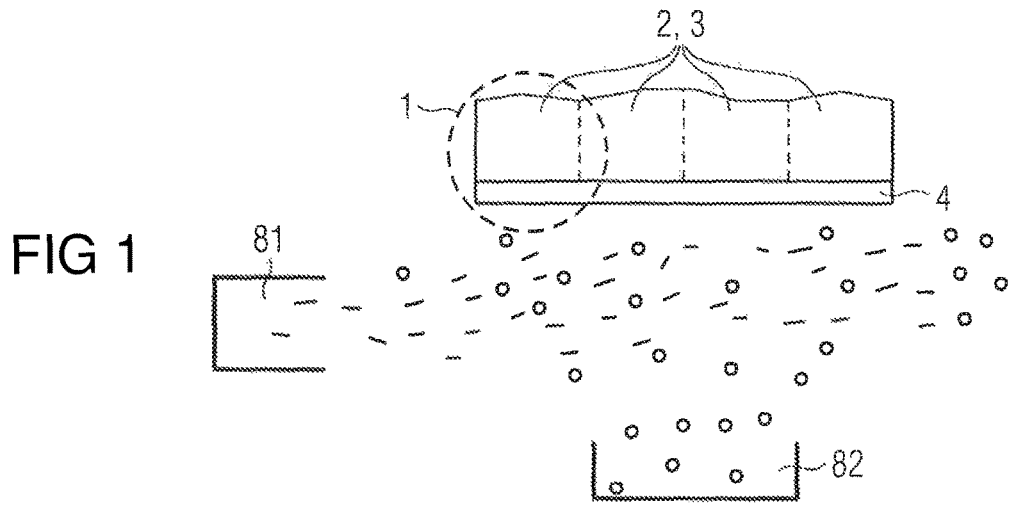
Figure 10:
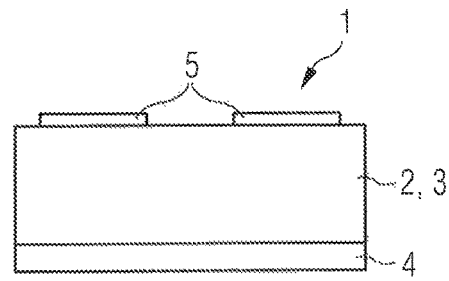
Figure 11:
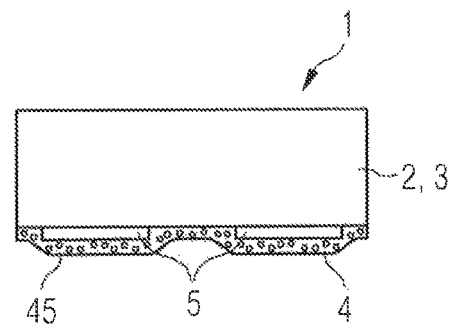
Figure 12A:
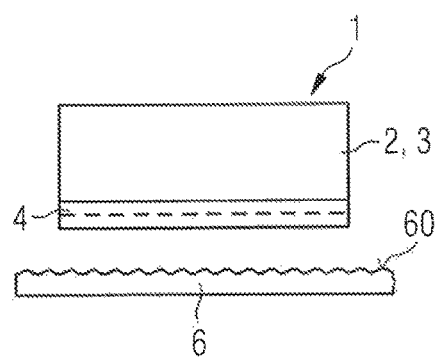
Figure 12B:
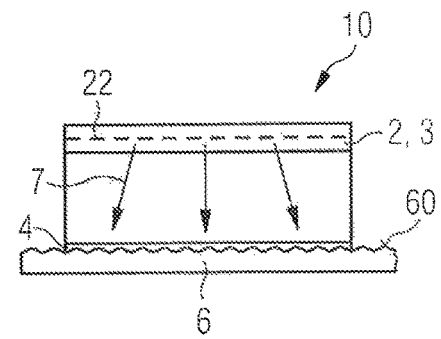

FIG. 1 schematically shows a method to produce an optic device;

FIGS. 2-7 show exemplary sectional views of exemplary embodiments of optic devices described herein;

FIGS. 8A-8C and FIGS. 9A-9C show schematic methods to produce assemblies described herein;

FIGS. 10 and 11 show schematic sectional views of exemplary embodiments of optic devices described herein;

FIGS. 12A-12B show a method to produce an assembly described herein; and

FIG. 13 schematically explains a calculation of a thermal resistance for optic devices and assemblies described herein.

DETAILED DESCRIPTION OF ILLUSTRATIVE EMBODIMENTS

FIG. 1 shows an exemplary method to produce an optic device 1. Two reactants 81, 82 are applied from, for example, heated cups to a back side of a wafer composite of a carrier body 3 and an active medium 2. By means of a reaction between the two reactants 81, 82, an adhesive layer 4 is formed in particular by means of polymerization. As the adhesive layer 4 is formed from the vapor phase, the adhesive layer 4 can be manufactured very precisely and also to be very thin.

The materials for the adhesive layer 4 could be deposited in a vacuum (e. g. 1×10−7 torr) to a pressure up to 100 psi. The substrate temperatures during deposition are preferably ranging from room temperature to 200° C. Many other parameters could be used, too, as described in particular in the article Ayse Asatekin et al., "Designing Polymer Surfaces via Vapor Deposition" in Materials Today, May 2010, Vol. 13, No. 5, pages 26 to 33 and references therein.

Along the dashed lines shown in FIG. 1, the wafer composite is singulated to the individual optic devices 1. Singulation is thus performed preferably after the adhesive layer 4 has been produced.

Figure 2:
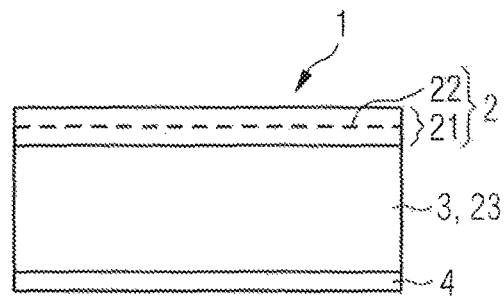

FIG. 2 shows an exemplary embodiment of the optic device 1. In this case, the optic device 1 includes a carrier body 3 which can be a growth substrate 23 for a semiconductor layer sequence 21. The growth substrate 23 is a sapphire substrate, for example. The semiconductor layer sequence 21 may be based on the material system AlInGaN.

The semiconductor layer sequence 21 comprises an active zone 22, for example, a single quantum well structure or a multiple quantum well structure. In the active zone 22, light is produced in the finished optic device 1 by means of electroluminescence. Hence, the optic device 1 can be an LED chip. The active medium 2 is thus the semiconductor layer sequence 21 comprising the active zone 22.

The adhesive layer 4 is applied to a side of the growth substrate 23 which is remote from the semiconductor layer sequence 21. Thus, the adhesive layer 4 is distant from the active medium 2.

Figure 3:
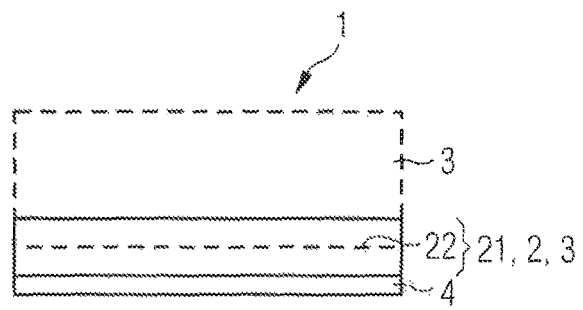

In the exemplary embodiment of FIG. 3, the adhesive layer 4 is applied directly to the semiconductor layer sequence 21. In this case, the semiconductor layer sequence 21 can be mechanically stable enough so that a separate carrier can be omitted. Hence, the semiconductor layer sequence 2 forms the carrier body 3 and the active zone 22 is the active medium 2 which is included in the semiconductor layer sequence 21 and, hence, in the carrier 3.

As an option it is shown in FIG. 3 that a separate carrier body 3 (drawn with a dashed line) can be present at a side of the semiconductor layer sequence 21 remote from the adhesive layer 4. In this case, the semiconductor layer sequence 21 does not need to be self-supporting.

Figure 4:
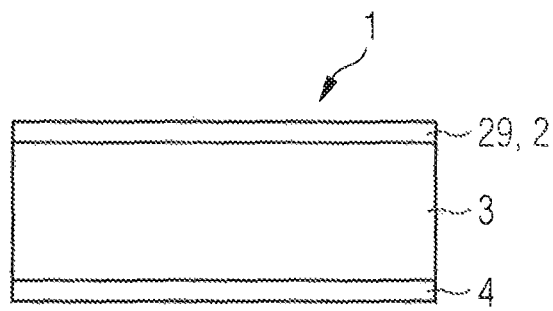

In FIG. 4 it is shown that the carrier body 3 is applied with the adhesive layer 4 on one side and with a phosphor 29 on the other side. The phosphor 29 is designed to produce radiation by means of photoluminescence. Thus, the phosphor 29 is the active medium 2.

The carrier body 3 is, for example, a ceramic body or a glass body. The phosphor 29 can be directly applied to the carrier body 3 or optionally is included in a matrix material like a siloxane or glass.

Figure 5:
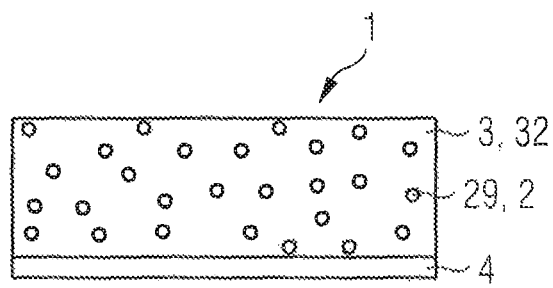

According to FIG. 5, the phosphor 29 is present in the form of particles which are embedded in a matrix material 32. The matrix material 32, which can be a siloxane or a glass, for example, forms the carrier body 3. The phosphor 29 is located in places at surfaces of the carrier body 3 and, thus, can be in direct contact with the adhesive layer 4.

As an alternative to FIG. 5, the phosphor 29 can be made of phosphor particles which can be sintered together. In this case, the matrix material can be omitted and the adhesive layer 4 can be directly applied to such a sintered phosphor 29.

Figure 6:
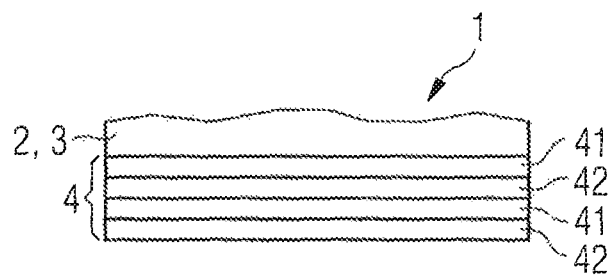

In FIG. 6 it is illustrated that the adhesive layer 4 is composed of a plurality of sub-layers 41, 42. There can be a sequence of first sub-layers 41 and second sub-layers 42 that are stacked one above the other in an alternating manner. Thus, the adhesive layer 4 can be a two-component adhesive and an adhesive effect can be produced by intermixing the sub-layers 41, 42, for example, by means of a mechanical process like pressing the optic device 1 to a support, not shown.

Figure 7:
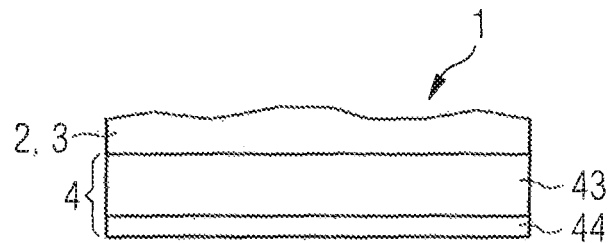

According to FIG. 7, the adhesive layer 4 comprises a base layer 43 and a cover layer 44. The cover layer 44 is preferably thinner than the base layer 43. The base layer 43 can be protected by the cover layer 44 until the optic device 1 is applied to a support, not shown.

The relatively complex setups of the adhesive layer 4 as shown in FIGS. 6 and 7 can also be present in all other exemplary embodiments. However, for a simplified manufacturing of the adhesive layer 4 it is preferred that the adhesive layer 4 is of a single homogeneous layer as shown, for example, in connection with FIGS. 1 to 5.

In FIG. 8, a method to produce an assembly to from the optic device 1 is explained. According to FIG. 8A, an optoelectronic semiconductor chip 9, like an LED chip, is provided. Further, the optic device 1 with the adhesive layer 4 is also provided. For example, the optic device 1 in this case contains the phosphor 29 and, thus, is a conversion element.

As an alternative as shown in FIG. 8B, the optic device 1 is an LED chip with the semiconductor layer sequence 21 and the adhesive layer 4. The other component that is provided is the phosphor 29. Contrary to what is shown in FIG. 8B, the phosphor 29 may also be provided with an adhesive layer 4, illustrated as a dashed line, so that there may be two of the optic devices 1.

The resulting assembly to is shown in FIG. 8C. The LED chip 9 and the phosphor 29 have been firmly and permanently connected by means of the adhesive layer 4, which has a thickness, for example, of just 100 nm to 200 nm.

According to FIG. 9A, the optic device 1 is an LED chip, too, that comprises the adhesive layer 4. Moreover, a support 6 with a mounting face 60 is provided. The support 6 is a part of a metallic lead frame. Preferably, the mounting face 60 is a mirror 61 for the radiation generated in the optic device 1.

As illustrated in FIG. 9B, as an alternative the adhesive layer 4 is applied to the mounting face 60 which is the mirror 61. The adhesive layer 4 can be applied to the mounting face 60 in a structured manner and, thus, just in places required to mount the semiconductor chip 9.

The resulting assembly to is shown in FIG. 9C. Contrary to what is shown in FIG. 9C, it is possible when coming from FIG. 9B that the adhesive layer 4 may protrude beyond side faces of the semiconductor chip 9. An electrical connection to the semiconductor chip 9 is realized, for example, by at least one bond wire 91.

According to FIG. 10, the active medium 2 and the carrier body 3 are supplied with electric contact areas 5. The contact areas 5 are located on a side opposite the adhesive layer 4. Thus, the adhesive layer 4 can be electrically insulating.

Contrary to that, see FIG. 11, the electric contact areas 5 and the adhesive layer 4 are located at the same side of the active medium 2. In this case it is possible that the adhesive layer 4 serves to make an electrical contact to the contact areas 5. Thus, the adhesive layer 4 is preferably electrically conductive.

To achieve an adhesive layer 4 that is sufficiently electrically conductive, the polymers of the adhesive layer 4 can be electrically conductive. As an alternative or in addition, the adhesive layer may comprise a plurality of particles 45 which are made of an electrically conductive material like carbon nanotubes or silver. As the particles 45 are comparably small and, thus, an electrical conductivity is just realized in a direction perpendicular to the contact areas 5, electrical shorts between adjacent contact areas 5 can be avoided.

In the method as shown in FIGS. 12A and 12B, first the optic device 1 is provided. For example, the optic device 1 is set up as illustrated in FIG. 7 above. Moreover, the support 6 is supplied. At the mounting face 60, the support comprises a roughening with a comparably low mean depth of structural elements.

As illustrated in FIG. 12B, the optic device 1 is pressed onto the mounting face 60. The adhesive layer 4 is penetrated by the roughening of the mounting face 60 so that the optic device 1 and the support 6 can come in direct contact with each other in places.

In FIG. 13, a calculation of a thermal resistance Rth is explained. The thermal resistance Rth essentially depends on a thickness of the respective materials and on a thermal conductivity of the respective materials. Moreover, the larger the size of a semiconductor chip, the lower the resulting thermal resistance Rth. As can be seen from FIG. 13, lower part, the total thermal resistance Rth strongly depends on the thickness of the adhesive layer as the thermal conductivity of the adhesive layer is small compared with other components of the device. Hence, when reducing the thickness of the adhesive layer 4, the total thermal resistance Rth can be significantly reduced.

The calculation in FIG. 13 is based on the device Duris S5 from the manufacturer Osram Opto Semiconductors that comprises two LED chips for producing blue light with a size of 650 µm×650 µm each.

The components shown in the figures follow, unless indicated otherwise, preferably in the specified sequence directly one on top of the other. Layers which are not in contact in the figures are preferably spaced apart from one another. If lines are drawn parallel to one another, the corresponding surfaces are preferably oriented parallel to one another. Likewise, unless indicated otherwise, the positions of the drawn components relative to one another are correctly reproduced in the figures.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

What is claimed is:

1. A method for producing an assembly, the method comprising:
   providing an optic device which is an LED chip comprising an active medium;
   providing a support being a metallic lead frame;
   applying an adhesive layer to at least one of the optic device or the support; and
   mounting the optic device on the support so that the optic device and the support are permanently and firmly connected,
   wherein the adhesive layer comprises at least one organic material and is applied by physical or chemical vapor phase deposition, and
   wherein a thickness of the adhesive layer is between 20 nm and 0.6 µm inclusive.

2. The method according to claim 1,
   wherein the active medium is a semiconductor layer sequence comprising an active zone configured to produce electromagnetic radiation by electroluminescence during operation, and
   wherein the LED chip comprises a carrier body which is a substrate to which the semiconductor layer sequence is applied or on which the semiconductor layer sequence is grown.

3. The method according to claim 2,
   wherein the adhesive layer is solely applied on a side of the substrate facing away from the semiconductor layer sequence, and
   wherein the substrate and the adhesive layer are light-transmissive for the electromagnetic radiation.

4. The method according to claim 1, wherein the adhesive layer comprises at least one of a polyimide, a siloxane, an acrylate or an epoxide.

5. The method according to claim 1, wherein the adhesive layer comprises a silicone-epoxide hybrid material.

6. The method according to claim 1, wherein the adhesive layer is applied by at least one of pulsed laser deposition, sputtering, initiated chemical vapor phase deposition or oxidative chemical vapor phase deposition.

7. The method according to claim 1, wherein the adhesive layer essentially consists of a plurality of organic materials and is grown of a plurality of sub-layers which are stacked one above the other.

8. The method according to claim 7,
   wherein the adhesive layer comprises a non-adhesive cover layer which is an outmost layer, and
   wherein mounting the optic device to the support comprises destroying the cover layer during mounting of the optic device.

9. The method according to claim 1,
   wherein the support has a mounting face with a roughening,
   wherein, during mounting, the adhesive layer is pressed onto the mounting face, and wherein the roughening penetrates the adhesive layer so that the support comes in direct contact with at least one of a carrier body of the LED hip or the active medium in places.

10. The method according to claim 1,
wherein at least one of the support, a carrier body of the LED chip or the active medium comprises electric contact areas,
wherein, during mounting on the support, the adhesive layer remains as a contiguous layer without holes so that the adhesive layer completely covers the electric contact areas, and
wherein the adhesive layer is electrically conductive.

11. The method according to claim 1,
wherein at least one of the support, a carrier body of the LED chip and r active medium comprises electric contact areas,
wherein, during mounting on the support, the electric contact areas remain free of the adhesive layer, and
wherein the adhesive layer is electrically insulating.

12. The method according to claim 1, wherein, during mounting on the support, the adhesive layer is cured by a temperature increase.

13. The method according to claim 1,
wherein, during mounting on the support, the adhesive layer is cured by radiation that initiates a photochemical reaction, and
wherein, immediately before mounting, the adhesive layer has a viscosity of at most 100 Pa·s at a temperature of 300 K.

14. The method according to claim 13, wherein the radiation to cure the adhesive layer is generated by a LED chip.

15. A method for producing an assembly comprising:
providing an optic device comprising an active medium mechanically carried by a carrier body or included in the carrier body;
applying an adhesive layer to at least one of the active medium or the carrier body; and
mounting the optic device that includes the adhesive layer on a support so that the optic device and the support are permanently and firmly connected,
wherein the adhesive layer comprises at least one organic material and is applied by physical or chemical vapor phase deposition,
wherein the support has a mounting face with a roughening,
wherein, during mounting, the adhesive layer is pressed onto the mounting face,
wherein the roughening penetrates the adhesive layer so that the support comes in direct contact with at least one of the carrier body or the active medium in places, and
wherein a thickness of the adhesive layer is between 20 nm and 0.6 µm inclusive.

16. The method according to claim 15,
wherein the active medium is a phosphor configured to produce electromagnetic radiation by photoluminescence during operation,
wherein the carrier body, and
wherein the carrier body and the adhesive layer are light-transmissive for the electromagnetic radiation.

17. The method according to claim 16,
wherein the carrier body is a matrix material in which the phosphor is embedded, and
wherein the phosphor is in places in direct contact with the adhesive layer.

18. A method for producing an assembly comprising:
providing an optic device comprising an active medium mechanically carried by a carrier body or included in the carrier body;
providing a support being a metallic lead frame;
applying an adhesive layer to at least one of the optic device or the support; and
mounting the optic device on the support so that the optic device and the support are permanently and firmly connected,
wherein the adhesive layer comprises at least one organic material and is applied by physical or chemical vapor phase deposition,
wherein the support has a mounting face with a roughening,
wherein, during mounting, the adhesive layer is pressed onto the mounting face,
wherein the roughening penetrates the adhesive layer so that the support comes in direct contact with at least one of the carrier body or the active medium in places, and
wherein a thickness of the adhesive layer is between 20 nm and 0.6 µm inclusive.

* * * * *

UNITED STATES PATENT AND TRADEMARK OFFICE
CERTIFICATE OF CORRECTION

PATENT NO. : 10,497,838 B2
APPLICATION NO. : 15/952194
DATED : December 3, 2019
INVENTOR(S) : I-Hsin Lin-Lefebvre Page 1 of 1

It is certified that error appears in the above-identified patent and that said Letters Patent is hereby corrected as shown below:

In the Claims

In Column 11, Line 16, Claim 11, delete "LED chip and r active medium" and insert --LED chip or the active medium--.

Signed and Sealed this
Twenty-fifth Day of February, 2020

Andrei Iancu
*Director of the United States Patent and Trademark Office*